US012784684B2

(12) United States Patent
Yuan et al.

(10) Patent No.: US 12,784,684 B2
(45) Date of Patent: Nov. 3, 2026

(54) PIXEL STRUCTURE WITH HIGH APERTURE RATIO, PIXEL DRIVE CIRCUIT, DRIVE METHOD AND DISPLAY DEVICE

(71) Applicant: HKC CORPORATION LIMITED, Shenzhen (CN)

(72) Inventors: Xin Yuan, Shenzhen (CN); Chen Chen, Shenzhen (CN); Xiufeng Zhou, Shenzhen (CN); Pei Xu, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 19/246,679

(22) Filed: Jun. 23, 2025

(65) Prior Publication Data

US 2025/0391366 A1 Dec. 25, 2025

(30) Foreign Application Priority Data

Jun. 24, 2024 (CN) ......................... 202410817700.3

(51) Int. Cl.
*H10K 59/122* (2023.01)
*G09G 3/3233* (2016.01)
(Continued)

(52) U.S. Cl.
CPC ......... *G09G 3/3233* (2013.01); *H10K 59/122* (2023.02); *G09G 3/3208* (2013.01);
(Continued)

(58) Field of Classification Search
CPC ............... H10K 59/122; H10K 59/121; H10K 59/1216; H10K 59/131; H10K 59/8051;
(Continued)

(56) References Cited

U.S. PATENT DOCUMENTS

2010/0156762 A1* 6/2010 Choi .................... G09G 3/3233 345/76
2012/0175645 A1* 7/2012 Omoto ................ G09G 3/3233 257/40

(Continued)

FOREIGN PATENT DOCUMENTS

CN 110164362 A 8/2019
CN 114639341 A 6/2022

(Continued)

*Primary Examiner* — Adam J Snyder

(57) ABSTRACT

A pixel structure which includes: a drive substrate; a first pixel definition layer, a pixel anode and a second pixel definition layer sequentially arranged on the drive substrate; a first metal structure arranged on the first pixel definition layer and a second metal structure arranged on the second pixel definition layer, where the pixel anode extends to a corresponding position below the second metal structure in the second pixel definition layer; a first insulation structure arranged on the first metal structure and a second insulation structure arranged on the second metal structure; an electroluminescent layer covering a portion of the first pixel definition layer, a portion of the pixel anode and a portion of the second pixel definition layer; and a pixel cathode covering the electroluminescent layer, where two ends of the pixel cathode are respectively connected to the first metal structure and the second metal structure.

10 Claims, 10 Drawing Sheets

(51) Int. Cl.

| | |
|---|---|
| *G09G 3/3208* | (2016.01) |
| *G09G 3/3266* | (2016.01) |
| *H10K 59/121* | (2023.01) |
| *H10K 59/131* | (2023.01) |
| *H10K 59/80* | (2023.01) |
| *H10K 102/00* | (2023.01) |

(52) U.S. Cl.
CPC ..... *G09G 3/3266* (2013.01); *G09G 2300/043* (2013.01); *G09G 2300/0465* (2013.01); *G09G 2300/0819* (2013.01); *G09G 2300/0852* (2013.01); *G09G 2310/08* (2013.01); *G09G 2320/0233* (2013.01); *H10K 59/121* (2023.02); *H10K 59/1216* (2023.02); *H10K 59/131* (2023.02); *H10K 59/8051* (2023.02); *H10K 2102/351* (2023.02)

(58) Field of Classification Search
CPC ........... H10K 2102/351; G09G 3/3233; G09G 3/3266; G09G 2300/043; G09G 2300/0465; G09G 2300/0819; G09G 2300/0852; G09G 2310/08; G09G 2320/0233; G09G 3/3208
See application file for complete search history.

(56) References Cited

U.S. PATENT DOCUMENTS

| | | | | |
|---|---|---|---|---|
| 2014/0204067 | A1 | 7/2014 | Gupta | |
| 2015/0187272 | A1* | 7/2015 | Kimura | G09G 3/3233 345/694 |
| 2024/0324295 | A1* | 9/2024 | Jiang | H10K 59/122 |

FOREIGN PATENT DOCUMENTS

| | | | | |
|---|---|---|---|---|
| CN | 114822403 | A | 7/2022 | |
| CN | 115802845 | A | 3/2023 | |
| CN | 115988905 | A * | 4/2023 | H10K 59/121 |
| CN | 116669477 | A | 8/2023 | |
| CN | 116709832 | A | 9/2023 | |
| CN | 117440713 | A | 1/2024 | |
| CN | 118201407 | A | 6/2024 | |
| CN | 118785748 | A | 10/2024 | |
| WO | 2016146053 | A1 | 9/2016 | |

* cited by examiner

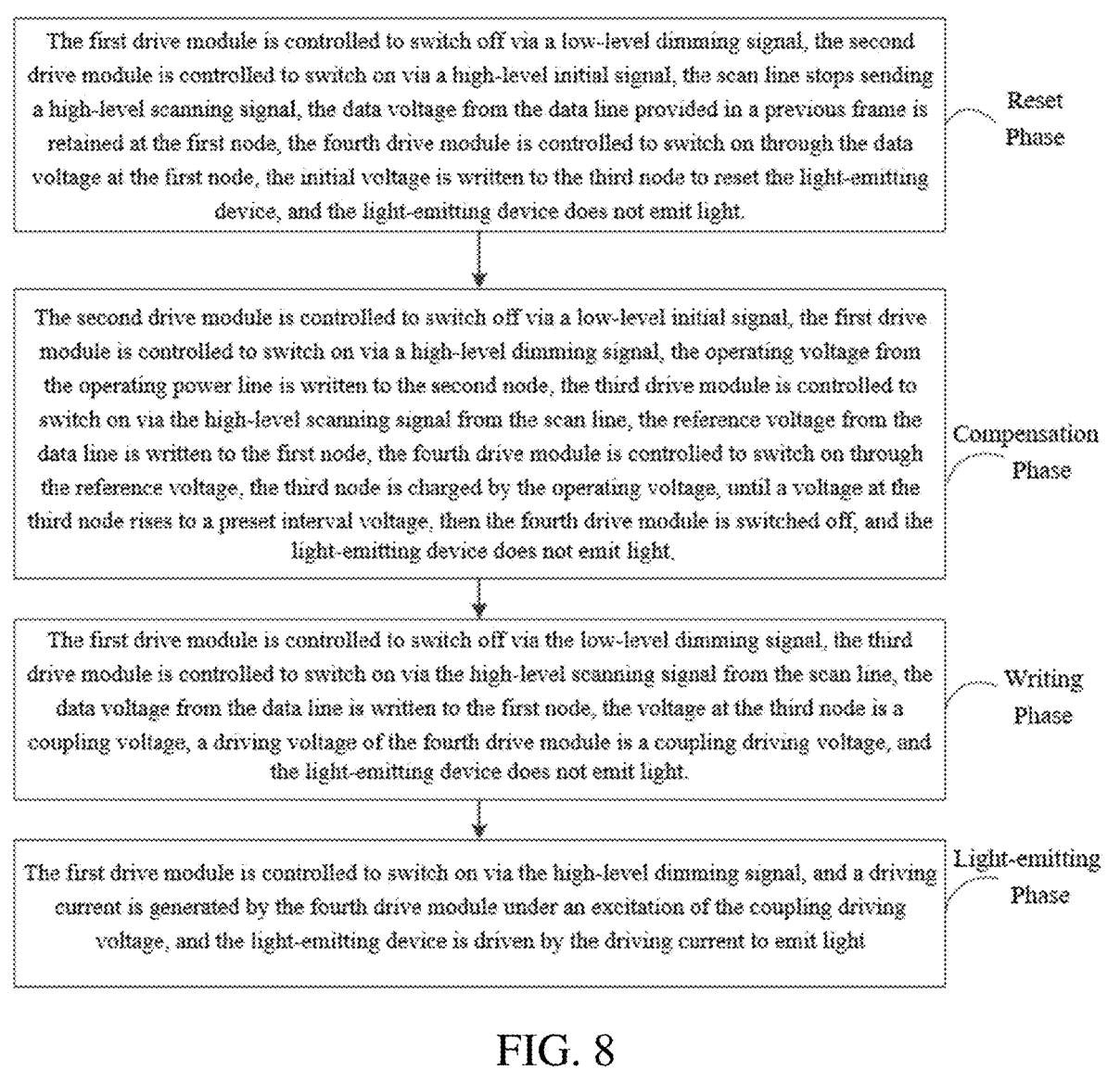

The first drive module is controlled to switch off via a low-level dimming signal, the second drive module is controlled to switch on via a high-level initial signal, the scan line stops sending a high-level scanning signal, the data voltage from the data line provided in a previous frame is retained at the first node, the fourth drive module is controlled to switch on through the data voltage at the first node, the initial voltage is written to the third node to reset the light-emitting device, and the light-emitting device does not emit light.

Reset Phase

↓

The second drive module is controlled to switch off via a low-level initial signal, the first drive module is controlled to switch on via a high-level dimming signal, the operating voltage from the operating power line is written to the second node, the third drive module is controlled to switch on via the high-level scanning signal from the scan line, the reference voltage from the data line is written to the first node, the fourth drive module is controlled to switch on through the reference voltage, the third node is charged by the operating voltage, until a voltage at the third node rises to a preset interval voltage, then the fourth drive module is switched off, and the light-emitting device does not emit light.

Compensation Phase

↓

The first drive module is controlled to switch off via the low-level dimming signal, the third drive module is controlled to switch on via the high-level scanning signal from the scan line, the data voltage from the data line is written to the first node, the voltage at the third node is a coupling voltage, a driving voltage of the fourth drive module is a coupling driving voltage, and the light-emitting device does not emit light.

Writing Phase

↓

The first drive module is controlled to switch on via the high-level dimming signal, and a driving current is generated by the fourth drive module under an excitation of the coupling driving voltage, and the light-emitting device is driven by the driving current to emit light Light-emitting Phase

FIG. 8

PIXEL STRUCTURE WITH HIGH APERTURE RATIO, PIXEL DRIVE CIRCUIT, DRIVE METHOD AND DISPLAY DEVICE

CROSS-REFERENCE TO RELATED APPLICATION

Pursuant to 35 U.S.C. § 119 and the Paris Convention, this application claims the benefit of Chinese Patent Application No. 202410817700.3 filed on Jun. 24, 2024, the content of which is incorporated herein by reference.

FIELD OF TECHNOLOGY

The following relates to the field of display technology, more particular to a pixel structure, a pixel drive circuit, a drive method and a display device.

BACKGROUND

The statements provided herein are merely background information related to the present application, and do not necessarily constitute any prior arts. Currently, the pixel structure of Organic Light-Emitting Diodes (OLED) is fabricated using the Fine Metal Mask (FMM) evaporation method. The mask is expensive and costly, while the bridge area of openings in the high-precision metal mask limits the effective area of the pixel light-emitting region, reducing the aperture ratio of the pixel structure. As a result, the aperture ratio of the pixel structure fails to meet user requirements, and the spatial footprint occupied by the pixel drive circuit layout is relatively large.

The existing technology has issues where the aperture ratio of the pixel structure fails to meet user requirements, and the pixel drive circuit layout occupies a relatively large spatial area.

SUMMARY

The embodiments of the present application provide a pixel structure, a pixel drive circuit, a drive method and a display device, which can solve the problem that the aperture ratio of the pixel structure fails to meet the user requirements and the spatial footprint occupied by the layout of the pixel drive circuit is relatively large.

In accordance with a first aspect, an embodiment of the present application provides a pixel structure, which includes:

a drive substrate;

a first pixel definition layer, a pixel anode and a second pixel definition layer that are sequentially distributed on the drive substrate, and the first pixel definition layer is not in contact with the second pixel definition layer;

a first metal structure disposed on the first pixel definition layer and a second metal structure disposed on the second pixel definition layer, and the pixel anode extends to a corresponding position below the second metal structure in the second pixel definition layer; a first insulation structure disposed on the first metal structure and a second insulation structure disposed on the second metal structure, and the first metal structure with the first insulation structure as well as the second metal structure with the second insulation structure respectively form an overhang structure;

an electroluminescent layer covering a portion of the first pixel definition layer, a portion of the pixel anode and a portion of the second pixel definition layer, and the electroluminescent layer is located between the first metal structure and the second metal structure; and a pixel cathode covering the electroluminescent layer, and two ends of the pixel cathode are respectively connected to the first metal structure and the second metal structure.

In one embodiment, a thickness of the first pixel definition layer and a thickness of the second pixel definition layer are both greater than a thickness of the pixel anode.

A thickness of the first metal structure or a thickness of the second metal structure is greater than a thickness of the first insulation structure. The thickness of the first metal structure or the thickness of the second metal structure is greater than a thickness of the second insulation structure.

The thickness of the pixel anode is greater than a thickness of the pixel cathode.

In one embodiment, a first patch capacitor is formed by the pixel anode and the pixel cathode, and a second patch capacitor is formed by the pixel anode and the second metal structure.

In accordance with a second aspect, an embodiment of the present application provides a pixel drive circuit, which is arranged on the drive substrate as described in the first aspect, and the pixel drive circuit includes: a first drive module, a second drive module, a scan line, data lines corresponding to pixel circuits, and a common ground line.

A control end of the first drive module is configured for receiving a dimming signal, an input end of the first drive module is connected to an operating power line for receiving an operating voltage, and an output end of the first drive module is respectively connected to first ends of multiple pixel circuits, and configured for sending the operating voltage to the first end of each pixel circuit.

A control end of the second drive module is configured for receiving an initial signal, an input end of the second drive module is connected to an initial power line for receiving an initial voltage, and an output end of the second drive module is respectively connected to the first end of each pixel circuit and configured for sending the initial voltage to the first end of each pixel circuit.

The scan line is respectively connected to a second end of each pixel circuit for sending a scanning signal to the second end of each pixel circuit.

Any of the data lines is connected to a third end of the pixel circuit corresponding to the data line for sending a reference voltage or a data voltage to the third end of the corresponding pixel circuit.

The common ground line is respectively connected to a fourth end of each pixel circuit for grounding the fourth end of each pixel circuit.

Each of the pixel circuits includes: a third drive module, a fourth drive module, a light-emitting device, a first storage unit and a second storage unit.

A control end of the third drive module is connected to the scan line, an input end of the third drive module is connected to a corresponding data line, and an output end of the third drive module is connected to a first node.

A control end of the fourth drive module is connected to the first node, an input end of the fourth drive module is connected to a second node. The second node is connected to the output end of the first drive module and the output end of the second drive module. An output end of the fourth drive module is connected to a third node.

An anode of the light-emitting device is connected to the third node, and a cathode of the light-emitting device is connected to the common ground line.

A first end of the first storage unit is connected to the first node, and a second end of the first storage unit is connected to the third node and a first end of the second storage unit.

A second end of the second storage unit is connected to the cathode of the light-emitting device and the common ground line.

In one embodiment, the pixel drive circuit also includes: a fifth drive module, a sixth drive module, a scan line, data lines corresponding to pixel circuits, and a common ground line.

A control end of the fifth drive module is configured for receiving the dimming signal, an input end of the fifth drive module is connected to the operating power line for receiving the operating voltage, and an output end of the fifth drive module is respectively connected to first ends of a preset number of pixel circuits among the multiple pixel circuits in one row, and configured for sending the operating voltage to the first end of each of the preset number of pixel circuits;

A control end of the sixth drive module is configured for receiving the initial signal, an input end of the sixth drive module is configured to be connected to the initial power line, and configured for receiving the initial voltage, and an output end of the sixth drive module is respectively connected to the first end of each pixel circuit in the one row, and configured for sending the initial voltage to the first end of each pixel circuit in the one row.

The scan line is respectively connected to a second end of each pixel circuit in the one row, and configured for sending the scanning signal to the second end of each pixel circuit in the one row.

Any data line is connected to a third end of the pixel circuit corresponding to the data line for sending the reference voltage or the data voltage to the third end of the corresponding pixel circuit.

The common ground line is respectively connected to a fourth end of each pixel circuit in the one row for grounding the fourth end of each pixel circuit in the one row.

In one embodiment, the first drive module, the second drive module, the third drive module, the fourth drive module, the fifth drive module and the sixth drive module are all thin film transistors.

The first storage unit and the second storage unit are both capacitors.

In accordance with a third aspect, an embodiment of the present application provides

- a drive method for driving the pixel drive circuit as described in any one of the contents of the second aspect, including:
- in a reset phase, the first drive module is controlled to switch off via a low-level dimming signal, the second drive module is controlled to switch on via a high-level initial signal, the scan line stops sending a high-level scanning signal, the data voltage from the data line provided in a previous frame is retained at the first node, the fourth drive module is controlled to switch on through the data voltage at the first node, the initial voltage is written to the third node to reset the light-emitting device, and the light-emitting device does not emit light;
- in a compensation phase, the second drive module is controlled to switch off via a low-level initial signal, the first drive module is controlled to switch on via a high-level dimming signal, the operating voltage from the operating power line is written to the second node, the third drive module is controlled to switch on via the high-level scanning signal from the scan line, the reference voltage from the data line is written to the first node, the fourth drive module is controlled to switch on through the reference voltage, the third node is charged by the operating voltage, until a voltage at the third node rises to a preset interval voltage, then the fourth drive module is switched off, and the light-emitting device does not emit light;
- in a writing phase, the first drive module is controlled to switch off via the low-level dimming signal, the third drive module is controlled to switch on via the high-level scanning signal from the scan line, the data voltage from the data line is written to the first node, the voltage at the third node is a coupling voltage, a driving voltage of the fourth drive module is a coupling driving voltage, and the light-emitting device does not emit light; and
- in a light-emitting phase, the first drive module is controlled to switch on via the high-level dimming signal, and a driving current is generated by the fourth drive module under an excitation of the coupling driving voltage, and the light-emitting device is driven by the driving current to emit light;
- where, the data voltage and the reference voltage of the previous frame are both greater than or equal to the initial voltage.

In one embodiment, the coupling voltage is calculated as follows:

$$V\_N3 = V\text{ref} - V\text{th} + \alpha \times (V\text{data} - V\text{ref}); \text{ and}$$

the coupling driving voltage is calculated as follows:

$$VGS = (1-\alpha) \times (V\text{data} - V\text{ref}) + V\text{th};$$

Where, V_N3 is the coupling voltage, VGS is the coupling driving voltage, Vref is the reference voltage, Vth is the threshold voltage of the fourth drive module, Vdata is the data voltage, $\alpha$ is a capacitance coefficient, and $\alpha = C1/(C1+C2)$.

In one embodiment, a range of the preset interval voltage is: Vinterval≥Vref−Vth; where, Vinterval is the preset interval voltage, Vref is the reference voltage, and Vth is the threshold voltage of the fourth drive module.

In accordance with a fourth aspect, an embodiment of the present application provides a display device, which includes the pixel drive circuit as described in any one of the contents of the second aspect.

Compared with the existing technology, the embodiments of the present application have the following beneficial effects:

The pixel structure provided in this application, compared to the existing technology where the bridge area of high-precision metal mask openings limits the effective area of the pixel light-emitting region and the high cost of the mask, utilizes the first metal structure with the first insulating structure and the second metal structure with the second insulating structure to confine the film-forming regions of the electroluminescent layer and the pixel cathode. This eliminates the need for a mask while enabling the fabrication of the electroluminescent layer and pixel cathode, thereby reducing the manufacturing cost of the pixel structure. At the same time, since the pixel anode extends in the second pixel definition layer to the corresponding position below the second metal structure, the pixel anode can form capacitive structures with the pixel cathode and the second metal structure respectively. Consequently, during the layout of the pixel drive circuit, certain capacitors do not need to occupy additional spatial positions, thereby reducing the spatial footprint of the pixel drive circuit layout. This further increases the area of the light-emitting region in the pixel structure and improves the aperture ratio of the pixel structure.

It can be understood that the beneficial effects of the second to fourth aspects mentioned above can be referred to the relevant description in the first aspect mentioned above, and will not be repeated here.

BRIEF DESCRIPTION OF THE DRAWINGS

In order to illustrate the technical schemes in the embodiments of the present application more clearly, the drawings required for use in description of the embodiments or existing technologies will be briefly introduced below. Obviously, the drawings described below are merely some embodiments of the present application. For ordinary technicians in this field, other drawings may also be obtained based on these drawings without paying creative efforts.

FIG. 8 is a schematic diagram illustrating driving phases of a drive method provided in an embodiment of the present application;

Figure 1:
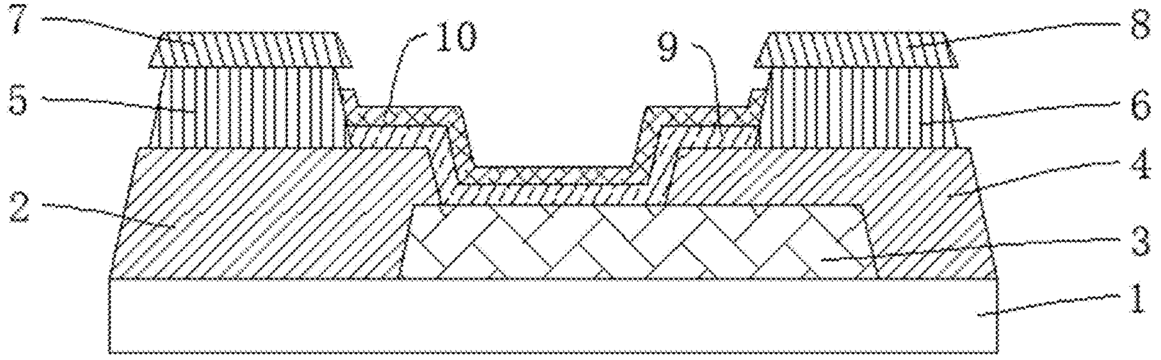
FIG. 1 is a cross-sectional schematic diagram of a pixel structure provided in an embodiment of the present application.

Reference numerals in the figures are listed as follows:

- 1, drive substrate; 2, first pixel definition layer; 3, pixel anode; 4, second pixel definition layer; 5, first metal structure; 6, second metal structure; 7, first insulation structure; 8, second insulation structure; 9, electroluminescent layer; 10, pixel cathode;
- 210, operating power line; 220, initial power line; 230, scan line; 240, data line; 250, common ground line;
- 110, first drive module; 120, second drive module; 130, pixel circuit; 131, third drive module; 132, fourth drive module; 133, light-emitting device; 134, first storage unit; 135, second storage unit; 140, fifth drive module; 150, sixth drive module;
- N1, first node; N2, second node; N3, third node; and
- Td1, first thin film transistor; Ti1, second thin film transistor; T1, third thin film transistor; DT, fourth thin film transistor; Td2, fifth thin film transistor; Ti2, sixth thin film transistor; OLED, organic light-emitting diode; C1, first capacitor; C2, second capacitor,

DETAILED DESCRIPTION OF THE EMBODIMENTS

In the following description, for the purpose of explanation rather than limitation, specific details such as specific system structures and technologies are proposed to provide a thorough understanding of the embodiments of the present application. However, it should be clear to persons skilled in the art that the present application may also be implemented in other embodiments without these specific details. In other cases, detailed descriptions of well-known systems, devices, circuits, and methods are omitted to avoid unnecessary details that hinder the description of the present application.

It should be understood that when used in the specification and the appended claims of the present application, the term "include" indicates the presence of the described features, wholes, steps, operations, elements and/or components, but does not exclude the presence or addition of one or more other features, wholes, steps, operations, elements, components and/or their collections.

It should also be understood that the term "and/or" used in the specification and the appended claims of the present application refers to any combination of one or more of the associated listed items and all possible combinations, and includes these combinations.

In addition, in the description of the specification and the appended claims of the present application, the terms "first", "second", "third", etc. are only used to distinguish the description, and cannot be understood as indicating or implying relative importance.

The reference to "one embodiment" or "some embodiments" described in the specification of the present application means that one or more embodiments of the present application include specific features, structures or characteristics described in combination with such embodiment(s). Thus, the sentences "in one embodiment", "in some embodiments", "in some other embodiments", "in some other embodiments", etc. appearing in different places in the specification do not necessarily refer to the same embodiment, but mean "one or more but not all embodiments", unless otherwise specifically emphasized in other ways. The terms "include", "comprises", "have" and their variations all mean "including but not limited to", unless otherwise specifically emphasized.

The technical schemes of the present application are illustrated below through specific embodiments.

In a first aspect, as shown in FIG. 1, an embodiment of the present application provides a pixel structure, which includes a drive substrate 1, a first pixel definition layer 2, a pixel anode 3, a second pixel definition layer 4, a first metal structure 5, a second metal structure 6, a first insulation structure 7, a second insulation structure 8, an electroluminescent layer 9 and a pixel cathode 10. The first pixel definition layer 2, the pixel anode 3 and the second pixel definition layer 4 are sequentially distributed on the drive substrate 1, and the first pixel definition layer 2 is not in contact with the second pixel definition layer 4. The first metal structure 5 is disposed on the first pixel definition layer 2, the second metal structure 6 is disposed on the second pixel definition layer 4, and the pixel anode 3 extends in the second pixel definition layer 4 to a corresponding position below the second metal structure 6. The first insulation structure 7 is disposed on the first metal structure 5 and the second insulation structure 8 is disposed on the second metal structure 6. The first metal structure 5 and the first insulation structure 7 form an overhang structure, and the second metal structure 6 and the second insulation structure 8 also form an overhang structure. The electroluminescent layer 9 is configured covering a portion of the first pixel definition layer 2, a portion of the pixel anode 3 and a portion of the second pixel definition layer 4, and the electroluminescent layer 9 is between the first metal structure 5 and the second metal structure 6. The pixel cathode 10 is configured covering the electroluminescent layer 9, two ends of the pixel cathode 10 are respectively connected to the first metal structure 5 and the second metal structure 6. Compared with the existing technology where an area bridged by the opening of the high-precision metal mask limits an effective area of the pixel light-emitting region and the high cost of the mask. The film-forming regions of the electroluminescent layer 9 and the pixel cathode 10 are confined by the first metal structure 5 with the first insulation structure 7 and the second metal structure 6 with the second insulation structure 8, thus, the fabrication of the electroluminescent layer 9 and the pixel cathode 10 can be achieved without requiring a mask, which reduces the manufacturing cost of the pixel structure, meanwhile, since the pixel anode 3 extends to the corresponding position below the second metal structure 6 in the second pixel definition layer 4, the pixel anode 3 can form capacitive structures with the pixel cathode 10 and the second metal structure 6 respectively. Thus, during the layout of the pixel drive circuit, certain capacitors do not require occupying spatial positions, thereby reducing the spatial footprint of the pixel drive circuit layout. This further increases the area of the light-emitting region in the pixel structure and improves the aperture ratio of the pixel structure.

It should be noted that the first insulation structure 7 and the second insulation structure 8 serve as the roof, while the first metal structure 5 and the second metal structure 6 constitute the main body. Both the first metal structure 5 with the first insulation structure 7 and the second metal structure 6 with the second insulation structure 8 form eave structures. Specifically, the projection of either the first insulation structure 7 or the second insulation structure 8 on the drive substrate 1 is greater than or equal to the projection of the first metal structure 5 or the second metal structure 6 on the drive substrate 1. In one embodiment, to expand the aperture ratio of the pixel structure, the projection of the first insulation structure 7 or the second insulation structure 8 on the drive substrate 1 is equal to the projection of the first metal structure 5 or the second metal structure 6 on the drive substrate 1.

In one embodiment, the thickness of the first pixel definition layer 2 and the thickness of the second pixel definition layer 4 are both greater than the thickness of the pixel anode 3. The material of the pixel definition layer includes an inorganic material, and the pixel definition layer is employed to isolate the pixel anode 3 from the metal structure to avoid contact between the pixel anode 3 and the metal structure. The thickness of the first metal structure 5 or the second metal structure 6 is greater than that of the first insulation structure 7, and the thickness of the first metal structure 5 or the second metal structure 6 is greater than that of the second insulation structure 8. This facilitates the connection between the first metal structure 5, the second metal structure 6, and the pixel cathode 10, thereby forming an integrated metal network between the metal structures and the pixel cathode 10, which reduces the voltage drop generated by the signal lines of the pixel cathode 10 itself. The thickness of the pixel anode 3 is greater than the thickness of the pixel cathode 10. Here, the materials of the first metal structure 5 and the second metal structure 6 include but are not limited to Mo, Al, Ti, Cu, etc. The materials of the first insulation structure 7 and the second insulation structure 8 include but are not limited to silicon nitride, silicon oxide, etc.

In one embodiment, the pixel anode 3 and the pixel cathode 10 form a first patch capacitor, the pixel anode 3 and the second metal structure 6 form a second patch capacitor, and the first patch capacitor and the second patch capacitor together form a capacitor in parallel with the light-emitting device 133. Thus, when the pixel drive circuit is laid out, the capacitor in parallel with the light-emitting device 133 does not need to occupy a spatial position. As a result, the spatial footprint of the pixel drive circuit layout is reduced, which further increases the area of the light-emitting region in the pixel structure, and improves the aperture ratio of the pixel structure.

In one embodiment, in addition to the pixel structure, a pixel drive circuit is also provided on the drive substrate 1. For example, the drive substrate 1 is also provided with a pixel drive circuit that drives the light-emitting device 133 to emit light. The pixel drive circuit may be arranged in an array, so the drive substrate 1 is also referred to as an array substrate. The pixel drive circuit includes devices such as thin film transistors and capacitors. The drive substrate 1 also includes signal lines such as scan lines 230 and data lines 240.

Compared with the existing technology, the embodiments of the present application have the following beneficial effects:

The pixel structure provided in this application, compared to the existing technology where the bridge area of high-precision metal mask openings limits the effective area of the pixel light-emitting region and the high cost of the mask, utilizes the first metal structure with the first insulating structure and the second metal structure with the second insulating structure to confine the film-forming regions of the electroluminescent layer and the pixel cathode. This eliminates the need for a mask while enabling the fabrication of the electroluminescent layer and pixel cathode, thereby reducing the manufacturing cost of the pixel structure. At the same time, since the pixel anode extends in the second pixel definition layer to the corresponding position below the second metal structure, the pixel anode can form capacitive structures with the pixel cathode and the second metal structure respectively. Consequently, during the layout of the pixel drive circuit, certain capacitors do not need to occupy additional spatial positions, thereby reducing the spatial footprint of the pixel drive circuit layout. This further increases the area of the light-emitting region in the pixel structure and improves the aperture ratio of the pixel structure.

Moreover, in the existing technology of organic light-emitting diode (OLED) display panels, the thin-film transistor (TFT) within each pixel structure gradually degrades with prolonged operation, resulting in a shift in the threshold voltage (Vth). Meanwhile, due to variations in manufacturing processes, each thin-film transistor has different threshold voltages (Vth). Since organic light-emitting diode (OLED) display panels are current-driven, the driving current is primarily influenced by the threshold voltage Vth. As the size of the display panel becomes larger and larger, the refresh rate of the display panel becomes higher and higher. For example, the refresh rate develops from 60 Hz to 120 Hz. The compensation effect of pixel drive circuits becomes relatively poor, resulting in uneven brightness issues in OLED display panels. At the same time, the resolution of the display panel is related to the size of the individual pixel structure. To improve resolution, it is necessary to reduce the area of a single pixel structure, thereby a decrease in the number of thin-film transistors in the pixel drive circuit of each pixel structure is required.

Figure 2:
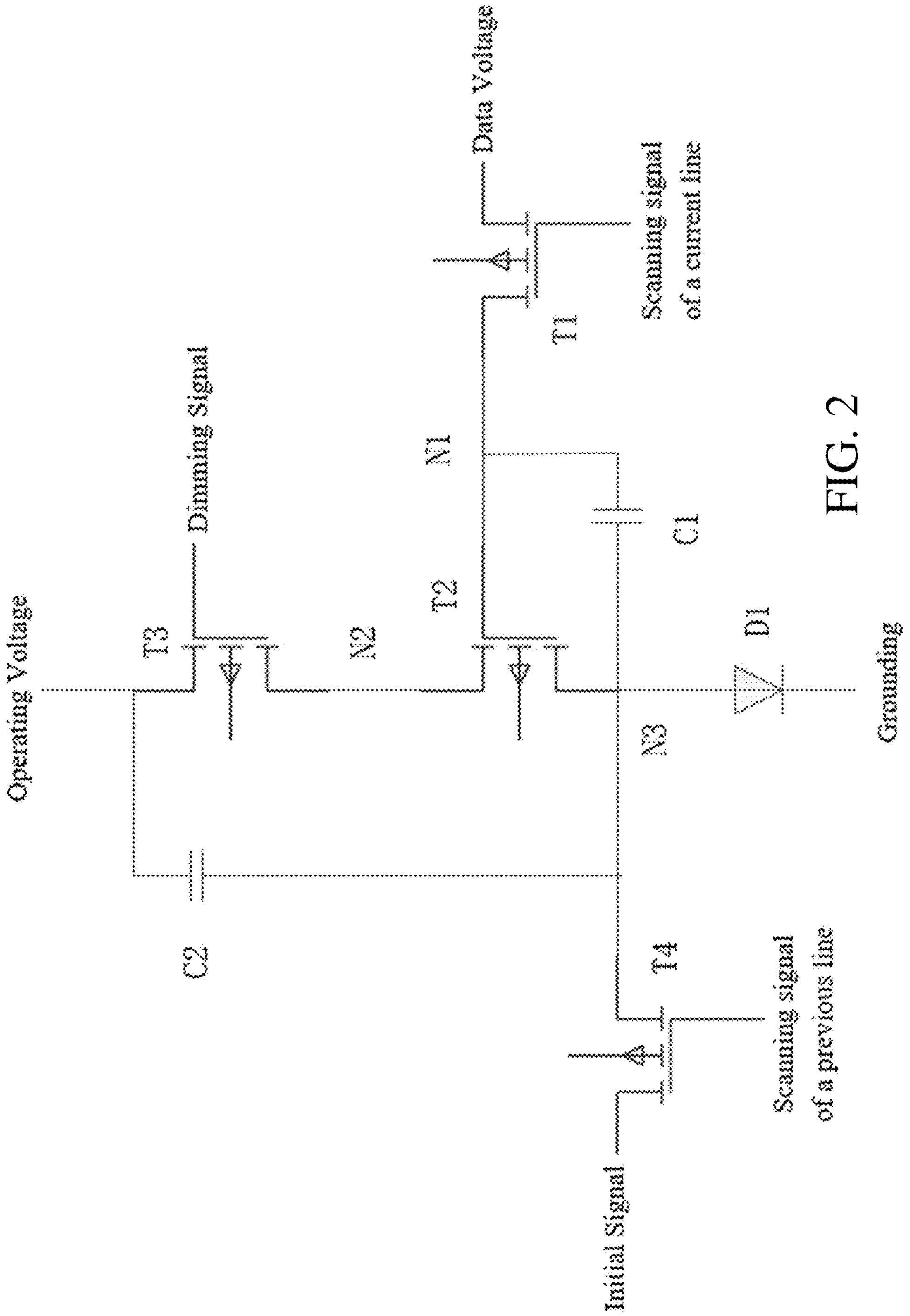
FIG. 2 is a structural schematic diagram of a 4T2C pixel drive circuit provided in the existing technologies.
Figure 3:
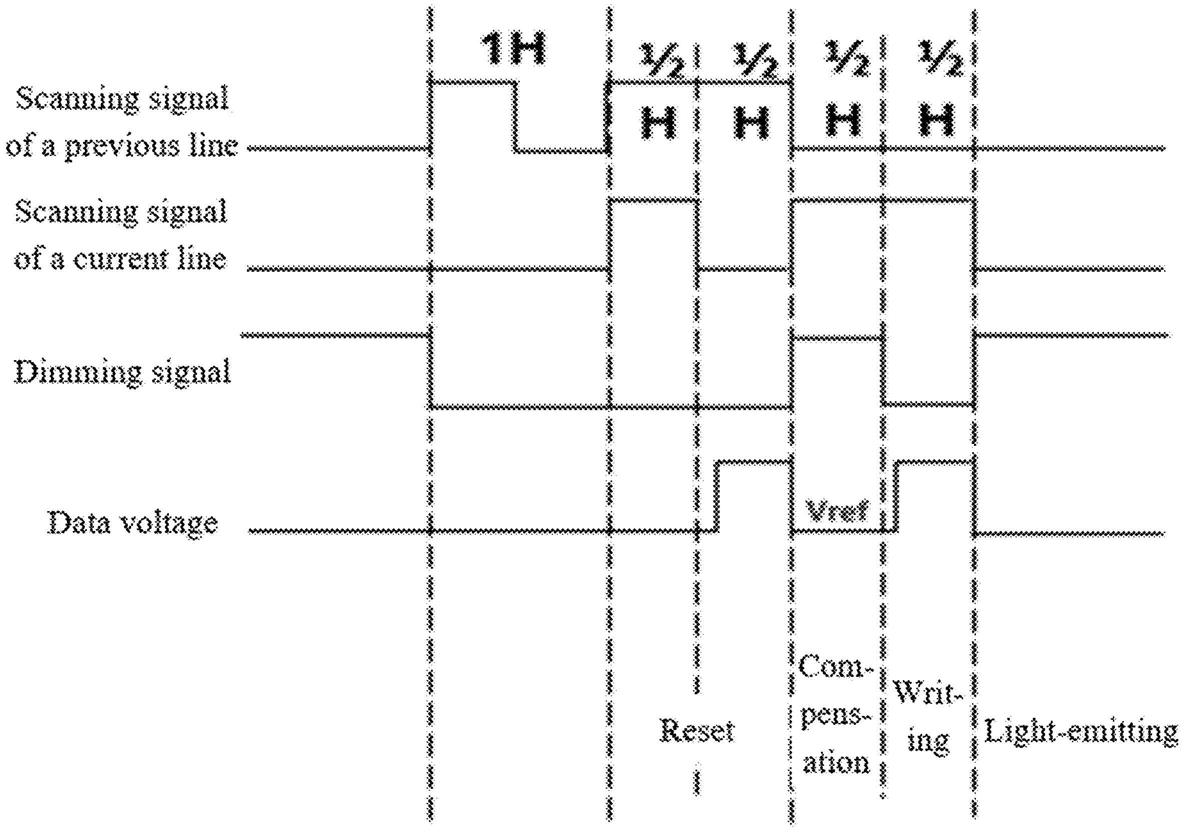
FIG. 3 is a driving timing schematic diagram of a 4T2C pixel drive circuit provided in the existing technologies.

As shown in FIG. 2, FIG. 2 is a structural schematic diagram of a 4T2C (i.e., 4 thin film transistors and 2 capacitors) pixel drive circuit in the existing technology, and as shown in FIG. 3, FIG. 3 is a driving timing schematic diagram corresponding to the 4T2C pixel drive circuit.

Figure 4:
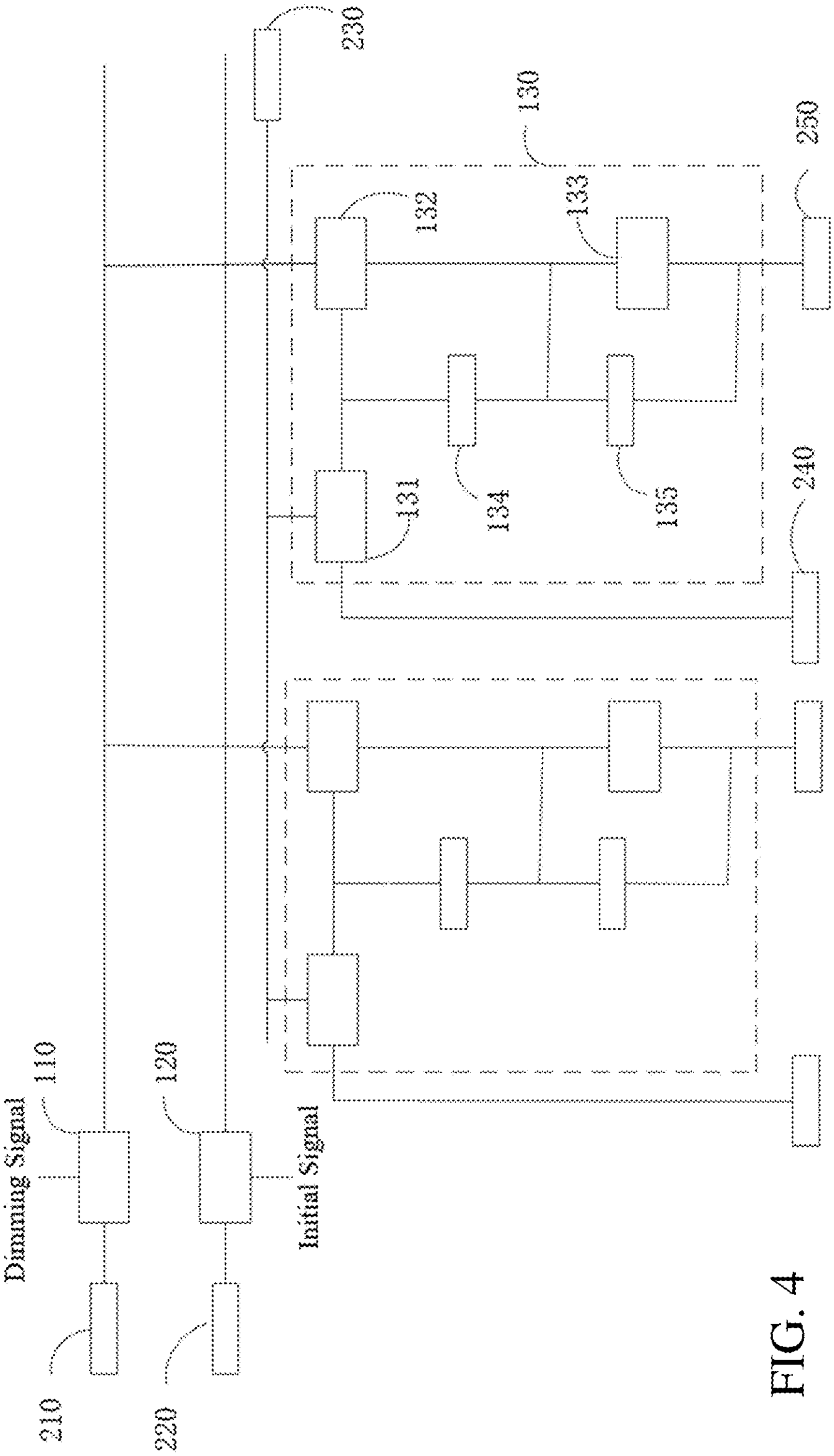
FIG. 4 is a structural schematic diagram of a pixel drive circuit provided in an embodiment of the present application.

In a second aspect, as shown in FIG. 4, an embodiment of the present application provides a pixel drive circuit, which is arranged on a drive substrate 1 of the pixel structure. The pixel drive circuit includes a first drive module 110, a second drive module 120, a scan line 230, data lines 240 corresponding to multiple pixel circuits 130 in one row, a common ground line 250 and the multiple pixel circuits 130. A control end of the first drive module 110 is configured for receiving a dimming signal, an input end of the first drive module 110 is connected to the operating power line 210 for receiving an operating voltage, and an output end of the first drive module 110 is respectively connected to first ends of the multiple pixel circuits 130 and configured for sending an operating voltage to the first end of each pixel circuit 130. A control end of the second drive module 120 is configured for receiving an initial signal, an input end of the second drive module 120 is connected to an initial power line 220 for receiving an initial voltage, and an output end of the second drive module 120 is respectively connected to the first end of each pixel circuit 130 and configured for sending the initial voltage to the first end of each pixel circuit 130. The scan line 230 is respectively connected to a second end of each pixel circuit 130 and configured for sending a scanning signal to the second end of each pixel circuit 130. Each data line 240 is connected to a third end of the pixel circuit 130 corresponding to the data line 240 and configured for sending a reference voltage or a data voltage to the third end of the corresponding pixel circuit 130. The common ground line 250 is respectively connected to a fourth end of each pixel circuit 130 and configured for grounding the fourth end of each pixel circuit 130. Each pixel circuit 130 includes a third drive module 131, a fourth drive module 132, a light-emitting device 133, a first storage unit 134 and a second storage unit 135. A control end of the third drive module 131 is connected to the scan line 230, an input end of the third drive module 131 is connected to a corresponding data line 240, and an output end of the third drive module 131 is connected to a first node N1. A control end of the fourth drive module 132 is connected to the first node N1, an input end of the fourth drive module 132 is connected to a second node N2, where the second node N2 is connected to an output end of the first drive module 110 and an output end of the second drive module 120, and an output end of the fourth drive module 132 is connected to a third node N3. An anode of the light-emitting device 133 is connected to the third node N3, and a cathode of the light-emitting device 133 is connected to the common ground line 250. A first end of the first storage unit 134 is connected to the first node N1, a second end of the first storage unit 134 is connected to the third node N3 and a first end of the second storage unit 135. A second end of the second storage unit 135 is connected to the cathode of the light-emitting device 133 and the common ground line 250.

The pixel driving circuit in this embodiment has a simple structure. By allowing all the multiple pixel circuits 130 in the entire row to share the first drive module 110 that provides the operating voltage and the second drive module 120 that provides the initial voltage, the fourth drive module 132 is compensated in combination with the coordinated switch-on timing of each drive module, thereby the threshold voltage drift caused by the aging of the fourth drive module 132 due to long-term use or the difference in threshold voltage caused by the process factors of the display panel is reduced. This minimizes the display brightness difference caused by the inconsistent light-emitting current of the organic light-emitting diode, and improves the uniformity in brightness of the display panel. Additionally, it eliminates the need for additional signals to control voltage changes during compensation, thereby reducing the number of thin-film transistors in the pixel circuit 130 of each pixel from four to two. In other words, each pixel circuit 130 transitions from a 4T2C circuit to a 2T2C circuit, this significantly reduces the footprint of each pixel circuit 130, increases the pixel density of the display panel, and further enhances the aperture ratio.

In one embodiment, the first drive module 110, the second drive module 120, the third drive module 131, and the fourth drive module 132 are all thin film transistors. That is, the first drive module 110 is a first thin film transistor Td1, the second drive module 120 is a second thin film transistor Ti1, the third drive module 131 is a third thin film transistor T1, and the fourth drive module 132 is a fourth thin film transistor DT. The first storage unit 134 and the second storage unit 135 are both capacitors. That is, the first storage unit 134 is a first capacitor C1, and the second storage unit 135 is a second capacitor C2.

It should be noted that the light-emitting device 133 includes the pixel anode 3, the electroluminescent layer 9 and the pixel cathode 10 as shown in FIG. 1. The pixel anode 3 is the anode of the light-emitting device 133, the pixel cathode 10 is the cathode of the light-emitting device 133, and the light-emitting device 133 is an organic light-emitting diode. The second capacitor C2 includes a first patch capacitor and a second patch capacitor, that is, the second capacitor C2 includes the first patch capacitor formed by the pixel anode 3 and the pixel cathode 10 and the second patch capacitor formed by the pixel anode 3 and the second metal structure 6, as shown in FIG. 1. Since the pixel anode 3 is extended to the corresponding position below the second metal structure 6 to form the second capacitor C2 in the pixel circuit 130, the area occupied by the pixel circuit 130 in the pixel is further reduced, thus, the pixel density of the display panel is improved, and the aperture ratio is further improved.

Figure 5:
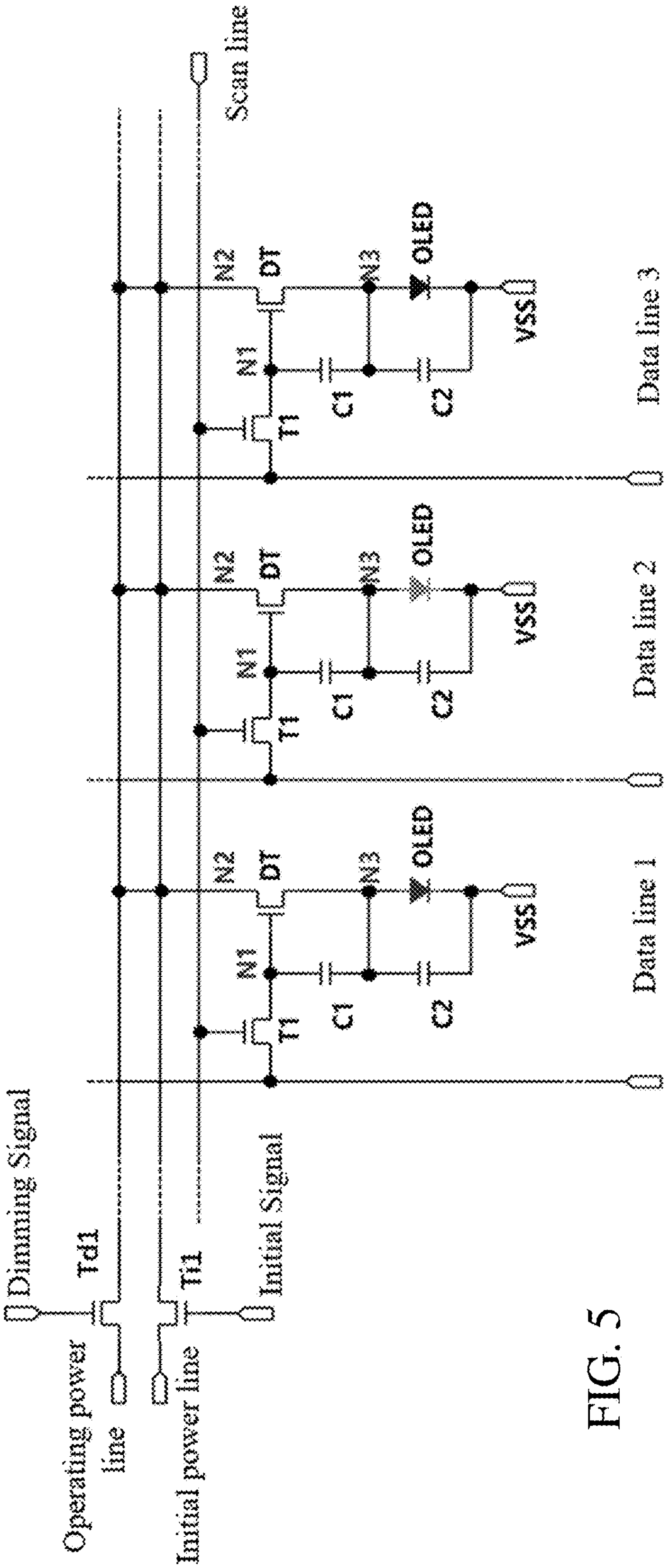
FIG. 5 is a structural schematic diagram of a pixel drive circuit provided in a specific embodiment of the present application.

In one embodiment, as shown in FIG. 5, the pixel drive circuit includes a first thin film transistor Td1, a second thin film transistor Ti1, a scan line 230, data lines 240 corresponding to multiple pixel circuits 130 in one row, a common ground line 250 and the multiple pixel circuits 130. A control end of the first thin film transistor Td1 is configured for receiving a dimming signal, an input end of the first thin film transistor Td1 is connected to the operating power line 210 for receiving an operating voltage, and an output end of the first thin film transistor Td1 is respectively connected to first ends of the multiple pixel circuits 130 and configured for sending an operating voltage to the first end of each pixel circuit 130. A control end of the second thin film transistor Ti1 is configured for receiving an initial signal, an input end of the second thin film transistor Ti1 is connected to the initial power line 220 for receiving the initial voltage, and an output end of the second thin film transistor Ti1 is respectively connected to the first end of each pixel circuit 130 for sending the initial voltage to the first end of each pixel circuit 130. The scan line 230 is respectively connected to a second end of each pixel circuit 130 for sending a scanning signal to the second end of each pixel circuit 130. Each data line 240 is connected to a third end of the pixel circuit 130 corresponding to the data line 240 for sending a reference voltage or a data voltage to the third end of the corresponding pixel circuit 130. The common ground line 250 is respectively connected to a fourth end of each pixel circuit 130 for grounding the fourth end of each pixel circuit 130. Each pixel circuit 130 includes a third thin film transistor T1, a fourth thin film transistor DT, an organic light-emitting diode OLED, a first capacitor C1 and a second capacitor C2. A control end of the third thin film transistor T1 is connected to the scan line 230, an input end of the third thin film transistor T1 is connected to the corresponding data line 240, and an output end of the third thin film transistor T1 is connected to the first node N1. A control end of the fourth thin film transistor DT is connected to the first node N1, an input end of the fourth thin film transistor DT is connected to the second node N2, where the second node N2 is connected to the output end of the first thin film transistor Td1 and the output end of the second thin film transistor Ti1, and an output end of the fourth thin film transistor DT is connected to the third node N3. An anode of the organic light-emitting diode OLED is connected to the third node N3, and a cathode of the light-emitting device is connected to the common ground line 250. A first end of the first capacitor C1 is connected to the first node N1, a second end of the first capacitor C1 is connected to the third node N3 and a first end of the second capacitor C2. A second end of the second capacitor C2 is connected to the cathode of the light-emitting device and the common ground line 250.

Figure 6:
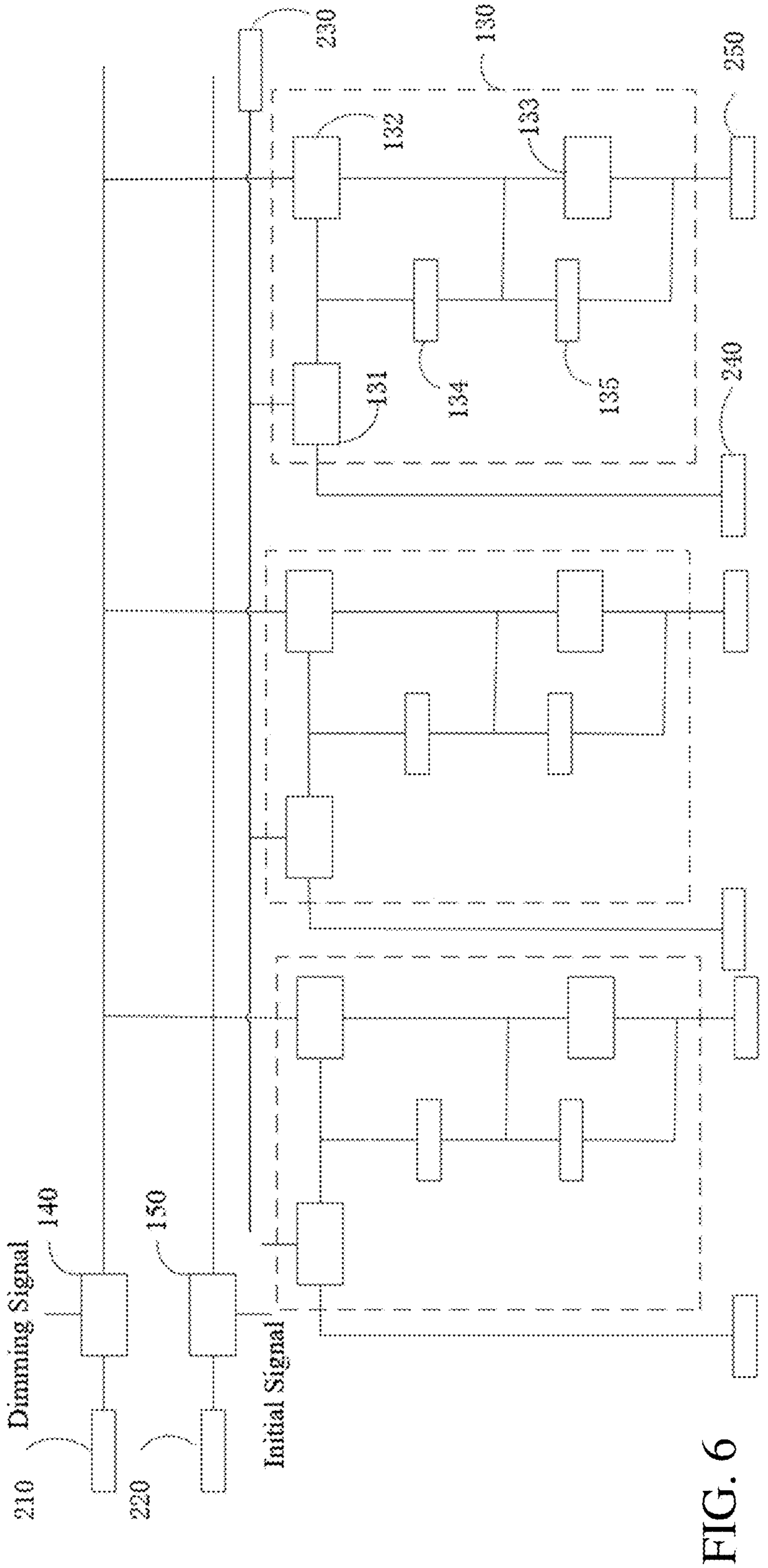
FIG. 6 is a structural schematic diagram of a pixel drive circuit provided in another embodiment of the present application.

In another embodiment, as shown in FIG. 6, the pixel drive circuit also includes a fifth drive module 140, a sixth drive module 150, a scan line 230, data lines 240 corresponding to pixel circuits 130 in one row, a common ground line 250 and the pixel circuits 130. A control end of the fifth drive module 140 is configured for receiving a dimming signal, an input end of the fifth drive module 140 is connected to an operating power line 210 for receiving an operating voltage, and an output end of the fifth drive module 140 is respectively connected to first ends of a preset number of pixel circuits 130 for sending the operating voltage to the first end of each of the preset number of pixel circuits 130. A control end of the sixth drive module 150 is configured for receiving an initial signal, an input end of the sixth drive module 150 is configured to be connected to an initial power line 220 and configured for receiving an initial voltage, and an output end of the sixth drive module 150 is respectively connected to the first end of each pixel circuit 130 in the one row for sending the initial voltage to the first end of each pixel circuit 130 in the one row. The scan line 230 is respectively connected to a second end of each pixel circuit 130 in the one row for sending a scanning signal to the second end of each pixel circuit 130 in the one row. Each data line 240 is connected to a third end of the pixel circuit 130 in the one row corresponding to the data line 240 for sending the reference voltage or data voltage to the third end of the corresponding pixel circuit 130. The common ground line 250 is respectively connected to a fourth end of each pixel circuit 130 in the one row for grounding the fourth end of each pixel circuit 130 in the one row.

In another embodiment, the fifth drive module 140 and the sixth drive module 150 are both thin film transistors. That is, the fifth drive module 140 is a fifth thin film transistor Td2, and the sixth drive module 150 is a sixth thin film transistor Ti2.

Figure 7:
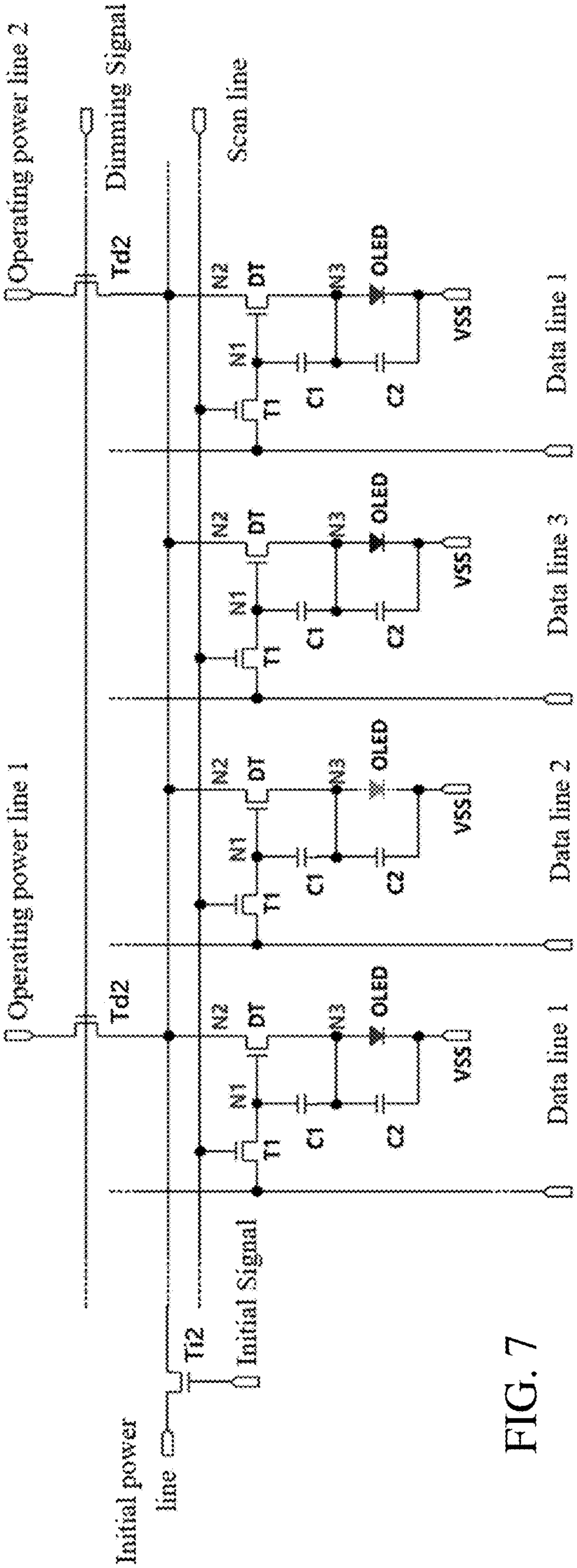
FIG. 7 is a structural schematic diagram of a pixel drive circuit provided in another specific embodiment of the present application.

In another embodiment, as shown in FIG. 7, the pixel drive circuit also includes a fifth thin film transistor Td2, a sixth thin film transistor Ti2, a scan line 230, data lines 240 corresponding to pixel circuits 130 in one row, a common ground line 250 and the pixel circuits 130. A control end of the fifth thin film transistor Td2 is configured for receiving a dimming signal, an input end of the fifth thin film transistor Td2 is connected to an operating power line 210 for receiving an operating voltage, an output end of the fifth thin film transistor Td2 is respectively connected to first ends of a preset number of pixel circuits 130 (as exemplarily shown in FIG. 7, the preset number of pixel circuits may be 3 pixel circuits) for sending an operating voltage to the first end of each of the preset number of pixel circuits 130. A control end of the sixth thin film transistor Ti2 is configured for receiving an initial signal, an input end of the sixth thin film transistor Ti2 is configured to be connected to an initial power line 220 and configured for receiving the initial voltage, and an output end of the sixth thin film transistor Ti2 is respectively connected to the first end of each pixel circuit 130 in the one row for sending the initial voltage to the first end of each pixel circuit 130 in the one row; the scan line 230 is respectively connected to a second end of each pixel circuit 130 in the one row for sending the scanning signal to the second end of each pixel circuit 130 in the one row. Each data line 240 is connected to a third end of the pixel circuit 130 corresponding to the data line 240 for sending a reference voltage or data voltage to the third end of the corresponding pixel circuit 130. The common ground line 250 is respectively connected to a fourth end of each pixel circuit 130 in the one row for grounding the fourth end of each pixel circuit 130 in the one row.

The structure of the pixel drive circuit of the present embodiment is simple. By allowing the preset number of pixel circuits in each row to share the fifth drive module that provides the operating voltage, and allowing the pixel circuits in the entire row to share the sixth drive module that provides the initial voltage, the fourth drive module is compensated in combination with the coordinated switch-on timing of each drive module, thereby the threshold voltage drift caused by the aging of the fourth drive module due to long-term use or the difference in the threshold voltage caused by the process factors of the display panel is reduced. This minimizes the display brightness difference caused by the inconsistent light-emitting current of the organic light-emitting diode, and improves the uniformity in brightness of the display panel. Additionally, it eliminates the need for additional signals to control voltage changes during compensation, thereby reducing the number of thin-film transistors in the pixel circuit of each pixel from four to two. In other words, each pixel circuit transitions from a 4T2C circuit to a 2T2C circuit, this significantly reduces the footprint of each pixel circuit, increases the pixel density of the display panel, and further enhances the aperture ratio. Meanwhile, since every preset number of pixel circuits in a row share the fifth drive module that provides the operating voltage, this avoids voltage drops caused by the signal lines themselves in pixel circuits far from the first drive module. Consequently, it enhances the consistency among the preset number of pixel circuits and further improves the brightness uniformity of the display panel.

Figure 9:
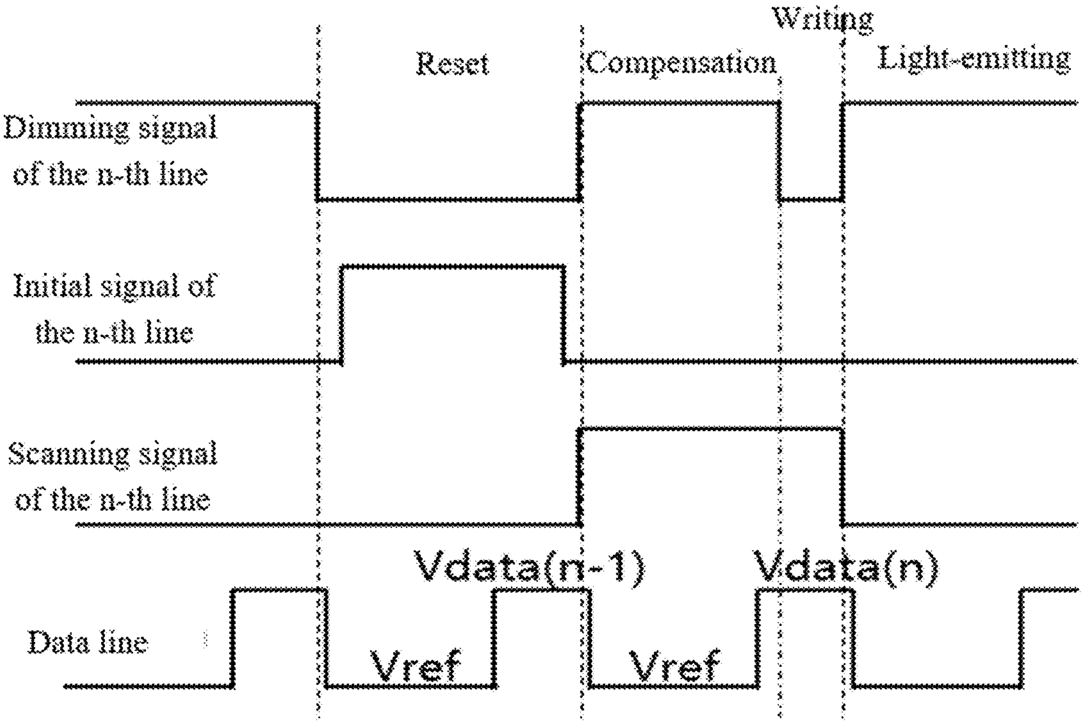
FIG. 9 is a driving timing schematic diagram of a pixel drive method provided in an embodiment of the present application.

In a third aspect, as shown in FIG. 8 and FIG. 9, an embodiment of the present application provides a drive method for driving a pixel drive circuit as described in any one of the second aspects, and the drive method includes a reset phase, a compensation phase, a writing phase, and a light-emitting phase. The specific driving process is as follows:

In the reset phase, the first drive module 110 is controlled to switch off via a low-level dimming signal, the second drive module 120 is controlled to switch on via a high-level initial signal, the scan line 230 stops sending the high-level scanning signal, a data voltage from the data line 240 provided in a previous frame is retained at the first node N1, the fourth drive module 132 is controlled to switch on via the data voltage of the first node N1, an initial voltage is written to the third node N3 to reset the light-emitting device 133, and the light-emitting device 133 does not emit light.

In the compensation phase, the second drive module 120 is controlled to switch off via a low-level initial signal, the first drive module 110 is controlled to switch on via a high-level dimming signal, an operating voltage from the operating power line 210 is written into the second node N2, the third drive module 131 is controlled to switch on via a high-level scanning signal from the scan line 230, a reference voltage from the data line 240 is written into the first node N1, the fourth drive module 132 is controlled to switch on by the reference voltage, the third node N3 is charged by the operating voltage, until the voltage at the third node N3 rises to a preset interval voltage, then the fourth drive module 132 is switched off, and the light-emitting device 133 does not emit light.

In the writing phase, the first drive module 110 is controlled to switch off via the low-level dimming signal, the third drive module 131 is controlled to switch on via the high-level scanning signal from the scan line 230, the data voltage from the data line 240 is written into the first node N1, the voltage at the third node N3 is a coupling voltage, a driving voltage of the fourth drive module 132 is a coupling driving voltage, and the light-emitting device 133 does not emit light.

In the light-emitting phase, the first drive module 110 is controlled to switch on via the high-level dimming signal, and a driving current is generated by the fourth drive module 132 under an excitation of the coupled driving voltage, and the light-emitting device 133 is driven by the driving current to emit light.

Here, the data voltage Vdata(n−1) and the reference voltage Vref of the previous frame are both greater than or equal to the initial voltage Vini, where Vref≥Vini+Vth, and Vinterval≥Vini−Vth, the coupling voltage is V_N3, the coupling driving voltage is VGS, the operating voltage is VDD, the threshold voltage of the fourth drive module 132 is Vth, the preset interval voltage is Vinterval, the dimming signal is EM, the initial signal is INI, and the data voltage from the data line 240 is Vdata.

In one embodiment, in combination with FIG. 5 and FIG. 9, in the reset phase, the first thin film transistor Td1 is controlled to switch off via a low level of the dimming signal EM, the second thin film transistor Ti1 is controlled to switch on via a high level of the initial signal INI, the scan line 230 stops sending the high-level scanning signal, the data voltage Vdata(n−1) from the data line 240 provided in a previous frame is retained at the first node N1, the fourth thin film transistor DT is controlled to switch on through the data voltage at the first node N1, the initial voltage Vini is written to the third node N3, to reset the organic light-emitting diode OLED, and the organic light-emitting diode OLED does not emit light.

In the compensation phase, the second thin film transistor Ti1 is controlled to switch off via a low level of the initial signal INI, the first thin film transistor Td1 is controlled to switch on via a high level of the dimming signal EM, the operating voltage VDD from the operating power line 210 is written into the second node N2, the third thin film transistor T1 is controlled to switch on via the high-level scanning signal from the scan line 230, and the reference voltage Vref from the data line 240 is written into the first node N1. Since the reference voltage Vref is greater than the threshold voltage Vth of the fourth drive module 132, the fourth thin film transistor DT is controlled to switch on through the reference voltage Vref, and the third node N3 is charged by the operating voltage VDD until the voltage of the third node N3 rises to the preset interval voltage Vinterval, and then the fourth thin film transistor DT is switched off, and the organic light-emitting diode OLED does not emit light.

In the writing phase, the first thin film transistor Td1 is controlled to switch off via the low level of the dimming signal EM, and the third thin film transistor T1 is controlled to switch on via the high-level scanning signal from the scan line 230. The data voltage Vdata from the data line 240 is written to the first node N1, and the voltage at the third node N3 is the coupling voltage V_N3, where V_N3=Vref−Vth+α×(Vdata−Vref). At this time, the driving voltage of the fourth thin film transistor DT is the coupling driving voltage VGS, where VGS=(1−α)×(Vdata−Vref)+Vth, and the organic light-emitting diode OLED does not emit light.

In the light-emitting phase, the first thin-film transistor Td1 is controlled to switch on via the high level of the dimming signal EM, and a driving current is generated by the fourth thin film transistor DT under the excitation of the coupling driving voltage VGS, and the organic light-emitting diode OLED is driven by the driving current to emit light.

In one embodiment, a calculation formula for the coupling voltage is expressed by:

$$V\_N3=V\mathrm{ref}-V\mathrm{th}+\alpha\times(V\mathrm{data}-V\mathrm{ref});$$

A calculation formula of the coupling driving voltage is expressed by:

$$VGS=(1-\alpha)\times(V\mathrm{data}-V\mathrm{ref})+V\mathrm{th};$$

In the formulas, V_N3 is the coupling voltage, VGS is the coupling driving voltage, Vref is the reference voltage, Vth is the threshold voltage of the fourth drive module 132, Vdata is the data voltage, a is a capacitance coefficient, α=C1/(C1+C2).

In one embodiment, a range of the preset interval voltage is defined as: Vinterval≥Vref−Vth;

Vinterval is the preset interval voltage, Vref is the reference voltage, and Vth is the threshold voltage of the fourth drive module 132.

In one embodiment, to ensure a light-emitting duration of the organic light-emitting diode OLED, a ratio of the sum of the time of the three phases, namely the reset phase, the compensation phase and the writing phase, to the time of the light-emitting phase is 2:8, and a ratio of the time of the reset phase, the compensation phase and the writing phase is 1:1:1.

In one embodiment, the pixel drive circuit may drive a row of pixels or a preset number of pixels. The aforementioned reset, compensation, writing, and light-emitting phases are repeated for the pixel driving circuits of all pixels, and so on. After completing the reset, compensation, writing, and light-emitting phases, the pixel driving circuits of each row will maintain light emission for the duration of one frame.

The drive method of this embodiment reduces the number of thin-film transistors in each pixel and expands the effective light-emitting area of the light-emitting device in each pixel, thereby improving the uniformity of display brightness while lowering the driving cost.

In a fourth aspect, an embodiment of the present application provides a display device, including the pixel drive circuit as described in any one of the second aspects.

For the beneficial effects of this embodiment, references may be made to the description of the second aspect, which will not be repeated here.

Figure 10:
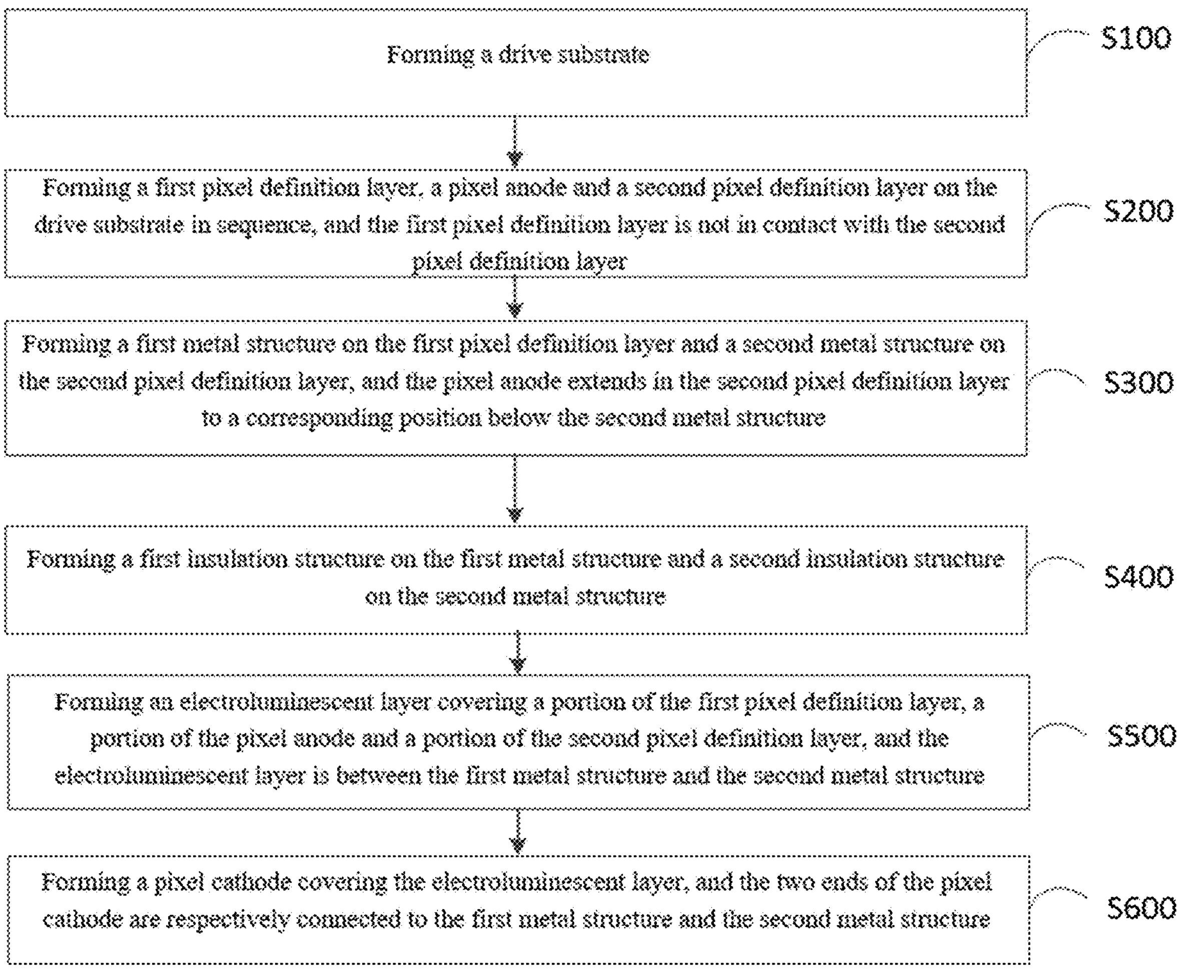
FIG. 10 is a flowchart illustrating a method for manufacturing a pixel structure provided in an embodiment of the present application.

In a fifth aspect, as shown in FIG. 10, an embodiment of the present application provides a method for manufacturing a pixel structure, which includes steps S100 to S600.

In step S100, a drive substrate 1 is formed.

In step S200, a first pixel definition layer 2, a pixel anode 3 and a second pixel definition layer 4 are formed on the drive substrate 1 in sequence, and the first pixel definition layer 2 is not in contact with the second pixel definition layer 4.

In step S300, a first metal structure 5 is formed on the first pixel definition layer 2 and a second metal structure 6 is formed on the second pixel definition layer 4, and the pixel anode 3 extends in the second pixel definition layer 4 to a corresponding position below the second metal structure 6.

In step S400, a first insulation structure 7 is formed on the first metal structure 5 and a second insulation structure 8 is formed on the second metal structure 6, and the first metal structure 5 with the first insulation structure 7 and the second metal structure 6 with the second insulation structure 8 respectively form an overhang structure.

In step S500, an electroluminescent layer 9 is formed covering a portion of the first pixel definition layer 2, a portion of the pixel anode 3 and a portion of the second pixel definition layer 4, and the electroluminescent layer 9 is between the first metal structure 5 and the second metal structure 6.

In step S600, a pixel cathode 10 is formed covering the electroluminescent layer 9, and the two ends of the pixel cathode 10 are respectively connected to the first metal structure 5 and the second metal structure 6.

It should be understood that the sequence numbers of the steps in the above embodiments do not imply an order of execution. The execution sequence of each process should be determined by its function and internal logic, and shall not impose any limitation on the implementation process of the embodiments in this application.

For the beneficial effects of this embodiment, references may be made to the description of the first aspect, which will not be repeated here.

In the above embodiments, the description of each embodiment has its own emphasis. For the part that is not described or recorded in detail in a certain embodiment, references may be made to the relevant description of other embodiments.

It will be appreciated by persons skill in the art that the units and algorithm steps of each example described in combination with the embodiments disclosed in this article may be implemented by electronic hardware, or a combination of computer software and electronic hardware. Whether these functions are executed in hardware or software depends on the specific application and design constraints of the technical schemes. Professional and technical personnel may employ different methods to implement the described functions for each specific application, but such implementation should not be considered to exceed the scope of this application.

The units described as separate components may or may not be physically separated, and the components displayed as units may or may not be physical units, that is, they may be located in one place or distributed on multiple network units. Some or all of the units may be selected according to actual needs to achieve the purpose of the scheme of this embodiment.

The above embodiments are used only to illustrate rather than limit the technical schemes of the present application. Although the present application is described in detail with reference to the above embodiments, ordinary technicians in this field should understand that it is still possible to modify the technical schemes recorded in the above embodiments, or replace some of the technical features therein by equivalent. These modifications or replacements do not make the essence of the corresponding technical schemes deviate from the spirit and scope of the technical schemes of the embodiments of the present application, and thus should all be included within the protection scope of the present application.

What is claimed is:

1. A pixel structure, comprising:

a drive substrate;

a first pixel definition layer, a pixel anode and a second pixel definition layer that are sequentially distributed on the drive substrate, wherein the first pixel definition layer is not in contact with the second pixel definition layer;

a first metal structure disposed on the first pixel definition layer and a second metal structure disposed on the second pixel definition layer, wherein the pixel anode extends to a corresponding position below the second metal structure in the second pixel definition layer, such that a first patch capacitor is formed by the pixel anode and the pixel cathode, and a second patch capacitor is formed by the pixel anode and the second metal structure;

a first insulation structure disposed on the first metal structure and a second insulation structure disposed on the second metal structure, wherein a projection of either the first insulation structure or the second insulation structure on the drive substrate is greater than or equal to a projection of the first metal structure or the second metal structure on the drive substrate, and the first metal structure with the first insulation structure and the second metal structure with the second insulation structure respectively form overhang structures;

an electroluminescent layer, covering a portion of the first pixel definition layer, a portion of the pixel anode and a portion of the second pixel definition layer, wherein the electroluminescent layer is located between the first metal structure and the second metal structure; and a pixel cathode, covering the electroluminescent layer, wherein two ends of the pixel cathode are respectively connected to the first metal structure and the second metal structure.

2. The pixel structure according to claim 1, wherein a thickness of the first pixel definition layer and a thickness of the second pixel definition layer are both greater than a thickness of the pixel anode;

a thickness of the first metal structure or a thickness of the second metal structure is greater than a thickness of the first insulation structure;

the thickness of the first metal structure or the thickness of the second metal structure is greater than a thickness of the second insulation structure; and the thickness of the pixel anode is greater than a thickness of the pixel cathode.

3. A pixel drive circuit, arranged on a drive substrate, wherein a first pixel definition layer, a pixel anode and a second pixel definition layer that are sequentially distributed on the drive substrate, the first pixel definition layer is not in contact with the second pixel definition layer; a first metal structure is disposed on the first pixel definition layer and a second metal structure is disposed on the second pixel definition layer, the pixel anode extends to a corresponding position below the second metal structure in the second pixel definition layer, such that a first patch capacitor is formed by the pixel anode and the pixel cathode and a second patch capacitor is formed by the pixel anode and the second metal structure; a first insulation structure is disposed on the first metal structure and a second insulation structure is disposed on the second metal structure, a projection of either the first insulation structure or the second insulation structure on the drive substrate is greater than or equal to a projection of the first metal structure or the second metal structure on the drive substrate, and the first metal structure with the first insulation structure and the second metal structure with the second insulation structure respectively form overhang structures; an electroluminescent layer is located between the first metal structure and the second metal structure, and the electroluminescent layer is arranged covering a portion of the first pixel definition layer, a portion of the pixel anode and a portion of the second pixel definition layer; and a pixel cathode is arranged covering the electroluminescent layer with two ends of the pixel cathode respectively connected to the first metal structure and the second metal structure; and the pixel drive circuit comprising:

a first drive module, wherein a control end of the first drive module is configured for receiving a dimming signal, an input end of the first drive module is connected to an operating power line for receiving an operating voltage, and an output end of the first drive module is respectively connected to first ends of multiple pixel circuits and configured for sending the operating voltage to the first ends of the multiple pixel circuits;

a second drive module, wherein a control end of the second drive module is configured for receiving an initial signal, an input end of the second drive module is connected to an initial power line for receiving an initial voltage, and an output end of the second drive module is respectively connected to the first ends of the multiple pixel circuits and configured for sending the initial voltage to the first ends of the multiple pixel circuits;

a scan line, wherein the scan line is respectively connected to second end of each pixel circuit and configured for sending a scanning signal to second ends of the multiple pixel circuits;

multiple data lines corresponding to the multiple pixel circuits, wherein the multiple data lines are respectively connected to corresponding third ends of the multiple pixel circuits for sending a reference voltage or a data voltage to the corresponding third ends of the multiple pixel circuits; and a common ground line, the common ground line is respectively connected to fourth ends of the multiple pixel circuits and configured for grounding the fourth ends of the multiple pixel circuits;

wherein, each of the multiple pixel circuits comprises:

a third drive module, a control end of the third drive module is connected to the scan line, an input end of the third drive module is connected to a corresponding data line, and an output end of the third drive module is connected to a first node;

a fourth drive module, a control end of the fourth drive module is connected to the first node, an input end of the fourth drive module is connected to a second node, wherein the second node is connected to the output end of the first drive module and the output end of the second drive module, and an output end of the fourth drive module is connected to a third node;

a light-emitting device, an anode of the light-emitting device is connected to the third node, and a cathode of the light-emitting device is connected to the common ground line; and a first storage unit and a second storage unit, a first end of the first storage unit is connected to the first node, a second end of the first storage unit is connected to the third node and a first end of the second storage unit, and a second end of the second storage unit is connected to the cathode of the light-emitting device and the common ground line.

4. The pixel drive circuit according to claim 3, wherein the pixel drive circuit further comprises:

a fifth drive module, a control end of the fifth drive module is configured for receiving the dimming signal, an input end of the fifth drive module is connected to the operating power line for receiving the operating voltage, and an output end of the fifth drive module is respectively connected to first ends of a preset number of pixel circuits among the multiple pixel circuits in one row, and configured for sending the operating voltage to the first ends of the preset number of pixel circuits;

a sixth drive module, a control end of the sixth drive module is configured for receiving the initial signal, an input end of the sixth drive module is configured to be connected to the initial power line and configured for receiving the initial voltage, and an output end of the sixth drive module is respectively connected to first ends of multiple pixel circuits in one row and configured for sending the initial voltage to the first ends of the multiple pixel circuits in the one row;

a scan line, the scan line is respectively connected to second ends of the multiple pixel circuits in the one row and configured for sending the scanning signal to the second ends of the multiple pixel circuits in the one row;

multiple data lines corresponding to the multiple pixel circuits in the one row, the multiple data lines are respectively connected to corresponding third ends of the multiple pixel circuits in the one row and configured for sending the reference voltage or the data voltage to the corresponding third ends of the multiple pixel circuits in the one row;

a common ground line, the common ground line is respectively connected to fourth ends of the multiple pixel circuits in the one row and configured for grounding the fourth ends of the multiple pixel circuits in the one row.

5. The pixel drive circuit according to claim 4, wherein the first drive module, the second drive module, the third drive module, the fourth drive module, the fifth drive module and the sixth drive module are all thin film transistors; and the first storage unit and the second storage unit are both capacitors.

6. A drive method, applied to drive a pixel drive circuit which is arranged on a drive substrate, wherein a first pixel definition layer, a pixel anode and a second pixel definition layer that are sequentially distributed on the drive substrate, the first pixel definition layer is not in contact with the second pixel definition layer; a first metal structure is disposed on the first pixel definition layer and a second metal structure is disposed on the second pixel definition layer, the pixel anode extends to a corresponding position below the second metal structure in the second pixel definition layer, such that a first patch capacitor is formed by the pixel anode and the pixel cathode and a second patch capacitor is formed by the pixel anode and the second metal structure; a first insulation structure is disposed on the first metal structure and a second insulation structure is disposed on the second metal structure, a projection of either the first insulation structure or the second insulation structure on the drive substrate is greater than or equal to a projection of the first metal structure or the second metal structure on the drive substrate, and the first metal structure with the first insulation structure and the second metal structure with the second insulation structure respectively form overhang structures; an electroluminescent layer is located between the first metal structure and the second metal structure, and the electroluminescent layer is arranged covering a portion of the first pixel definition layer, a portion of the pixel anode and a portion of the second pixel definition layer; and a pixel cathode is arranged covering the electroluminescent layer with two ends of the pixel cathode respectively connected to the first metal structure and the second metal structure;

the pixel drive circuit comprising:

a first drive module, wherein a control end of the first drive module is configured for receiving a dimming signal, an input end of the first drive module is connected to an operating power line for receiving an operating voltage, and an output end of the first drive module is respectively connected to first ends of multiple pixel circuits and configured for sending the operating voltage to the first ends of the multiple pixel circuits;

a second drive module, wherein a control end of the second drive module is configured for receiving an initial signal, an input end of the second drive module is connected to an initial power line for receiving an initial voltage, and an output end of the second drive module is respectively connected to the first ends of the multiple pixel circuits and configured for sending the initial voltage to the first ends of the multiple pixel circuits;

a scan line, wherein the scan line is respectively connected to second end of each pixel circuit and configured for sending a scanning signal to second ends of the multiple pixel circuits;

multiple data lines corresponding to the multiple pixel circuits, wherein the multiple data lines are respectively connected to corresponding third ends of the multiple pixel circuits for sending a reference voltage or a data voltage to the corresponding third ends of the multiple pixel circuits; and a common ground line, the common ground line is respectively connected to fourth ends of the multiple pixel circuits and configured for grounding the fourth ends of the multiple pixel circuits;

wherein, each of the multiple pixel circuits comprises:

a third drive module, a control end of the third drive module is connected to the scan line, an input end of the third drive module is connected to a corresponding data line, and an output end of the third drive module is connected to a first node;

a fourth drive module, a control end of the fourth drive module is connected to the first node, an input end of the fourth drive module is connected to a second node, wherein the second node is connected to the output end of the first drive module and the output end of the second drive module, and an output end of the fourth drive module is connected to a third node;

a light-emitting device, an anode of the light-emitting device is connected to the third node, and a cathode of the light-emitting device is connected to the common ground line; and a first storage unit and a second storage unit, a first end of the first storage unit is connected to the first node, a second end of the first storage unit is connected to the third node and a first end of the second storage unit, and a second end of the second storage unit is connected to the cathode of the light-emitting device and the common ground line, and the drive method comprising:

in a reset phase, the first drive module is controlled to switch off via a low-level dimming signal, the second drive module is controlled to switch on via a high-level initial signal, the scan line stops sending a high-level scanning signal, the data voltage from a data line provided in a previous frame is retained at the first node, the fourth drive module is controlled to switch on through the data voltage at the first node, the initial voltage is written to the third node to reset the light-emitting device, and the light-emitting device does not emit light;

in a compensation phase, the second drive module is controlled to switch off via a low-level initial signal, the first drive module is controlled to switch on via a high-level dimming signal, the operating voltage from the operating power line is written to the second node, the third drive module is controlled to switch on via the high-level scanning signal from the scan line, the reference voltage from the data line is written to the first node, the fourth drive module is controlled to switch on through the reference voltage, the third node is charged by the operating voltage, until a voltage at the third node rises to a preset interval voltage, then the fourth drive module is switched off, and the light-emitting device does not emit light;

in a writing phase, the first drive module is controlled to switch off via the low-level dimming signal, the third drive module is controlled to switch on via the high-level scanning signal from the scan line, the data voltage from the data line is written to the first node, the voltage at the third node is a coupling voltage, a driving voltage of the fourth drive module is a coupling driving voltage, and the light-emitting device does not emit light; and in a light-emitting phase, the first drive module is controlled to switch on via the high-level dimming signal, and a driving current is generated by the fourth drive module under an excitation of the coupling driving voltage, and the light-emitting device is driven by the driving current to emit light;

wherein, the data voltage and the reference voltage of the previous frame are both greater than or equal to the initial voltage.

7. The drive method according to claim 6, wherein the pixel drive circuit further comprises:

a fifth drive module, a control end of the fifth drive module is configured for receiving the dimming signal, an input end of the fifth drive module is connected to the operating power line for receiving the operating voltage, and an output end of the fifth drive module is respectively connected to first ends of a preset number of pixel circuits among the multiple pixel circuits in one row, and configured for sending the operating voltage to the first ends of the preset number of pixel circuits;

a sixth drive module, a control end of the sixth drive module is configured for receiving the initial signal, an input end of the sixth drive module is configured to be connected to the initial power line and configured for receiving the initial voltage, and an output end of the sixth drive module is respectively connected to first ends of multiple pixel circuits in one row and configured for sending the initial voltage to the first ends of the multiple pixel circuits in the one row;

a scan line, the scan line is respectively connected to second ends of the multiple pixel circuits in the one row and configured for sending the scanning signal to the second ends of the multiple pixel circuits in the one row;

multiple data lines corresponding to the multiple pixel circuits in the one row, the multiple data lines are respectively connected to corresponding third ends of the multiple pixel circuits in the one row and configured for sending the reference voltage or the data voltage to the corresponding third ends of the multiple pixel circuits in the one row;

a common ground line, the common ground line is respectively connected to fourth ends of the multiple pixel circuits in the one row and configured for grounding the fourth ends of the multiple pixel circuits in the one row.

8. The drive method according to claim 7, wherein the first drive module, the second drive module, the third drive module, the fourth drive module, the fifth drive module and the sixth drive module are all thin film transistors; and the first storage unit and the second storage unit are both capacitors.

9. The drive method according to claim 6, wherein a calculation formula of the coupling voltage is expressed by:

$$V\_N3 = V\text{ref} - V\text{th} + \alpha \times (V\text{data} - V\text{ref});\ \text{and}$$

a calculation formula of the coupling driving voltage is expressed by:

$$VGS = (1-\alpha) \times (V\text{data} - V\text{ref}) + V\text{th};$$

wherein, V_N3 is the coupling voltage, VGS is the coupling driving voltage, Vref is the reference voltage, Vth is a threshold voltage of the fourth drive module, Vdata is the data voltage, a is a capacitance coefficient, and α=C1/(C1+C2).

10. The drive method according to claim 6, wherein a range of the preset interval voltage is: Vinterval≥Vref−Vth;

wherein, Vinterval is the preset interval voltage, Vref is the reference voltage, and Vth is a threshold voltage of the fourth drive module.

* * * * *